US012682677B2

(12) United States Patent
Du

(10) Patent No.: US 12,682,677 B2
(45) Date of Patent: Jul. 14, 2026

(54) ULTRASONIC FINGERPRINT IDENTIFICATION APPARATUS AND LAMINATION THICKNESS ADJUSTMENT METHOD THEREFOR, AND ELECTRONIC DEVICE

(71) Applicant: HUIKE (SINGAPORE) HOLDING PTE.LTD., Singapore (SG)

(72) Inventor: Canhong Du, Shenzhen City (CN)

(73) Assignee: HUIKE (SINGAPORE) HOLDING PTE. LTD., Singapore (SG)

( * ) Notice: Subject to any disclaimer, the term of this patent is extended or adjusted under 35 U.S.C. 154(b) by 0 days.

(21) Appl. No.: 19/006,022

(22) Filed: Dec. 30, 2024

(65) Prior Publication Data

US 2025/0246019 A1     Jul. 31, 2025

Related U.S. Application Data

(63) Continuation of application No. PCT/IB2024/057914, filed on Aug. 15, 2024.

(30) Foreign Application Priority Data

Oct. 17, 2023     (CN) .......................... 202311350805.4

(51) Int. Cl.
| | |
|---|---|
| *G06V 40/13* | (2022.01) |
| *G06V 40/12* | (2022.01) |
| *H10N 30/30* | (2023.01) |

(52) U.S. Cl.
CPC ...... *G06V 40/1306* (2022.01); *G06V 40/1365* (2022.01); *H10N 30/302* (2023.02)

(58) Field of Classification Search
CPC ........... G06V 40/1306; G06V 40/1365; H10N 30/302; H10N 30/20
See application file for complete search history.

(56) References Cited

U.S. PATENT DOCUMENTS

2017/0364726 A1* 12/2017 Buchan .............. G01N 29/2437
2020/0184176 A1 6/2020 Liu et al.
(Continued)

FOREIGN PATENT DOCUMENTS

| CN | 113165017 A | 7/2021 |
|---|---|---|
| CN | 108764087 B | 10/2021 |

(Continued)

OTHER PUBLICATIONS

First Office Action issued in Chinese Patent Application No. 202311350805.4; mailed Aug. 9, 2024; 26 pgs.
(Continued)

*Primary Examiner* — Abhishek Sarma
(74) *Attorney, Agent, or Firm* — Zhong Law, LLC

(57) ABSTRACT

Embodiments of the present disclosure provide an ultrasonic fingerprint identification apparatus and a lamination thickness adjustment method therefor, and an electronic device, and relate to the technical field of fingerprint identification. A specific embodiment of the ultrasonic fingerprint identification apparatus comprises: an integrated chip and a piezoelectric transducer, wherein a back surface of the integrated chip is connected to an application layer, and the piezoelectric transducer is located on a surface of the integrated chip. Through excitation of a driving pulse, the piezoelectric transducer transmits an ultrasonic signal to the application layer through the integrated chip, and a signal receiving circuit of the integrated chip receives an ultrasonic echo signal returned from a finger through the application layer. The embodiment can avoid an interference effect of surface defects of a lamination on fingerprint imaging, and improve accuracy of fingerprint identification.

19 Claims, 6 Drawing Sheets

(56) References Cited

U.S. PATENT DOCUMENTS

| | | | |
|---|---|---|---|
| 2020/0293736 A1* | 9/2020 | Liu | ...................... H10N 30/302 |
| 2021/0303814 A1 | 9/2021 | Liu et al. | |
| 2021/0305487 A1* | 9/2021 | Li | ......................... H10N 30/05 |
| 2023/0397902 A1* | 12/2023 | Du | ...................... G01S 7/52046 |

FOREIGN PATENT DOCUMENTS

| | | |
|---|---|---|
| CN | 114758367 A | 7/2022 |
| CN | 115188034 A | 10/2022 |
| CN | 218181550 U | 12/2022 |
| CN | 115909420 A | 4/2023 |
| WO | 2023051231 A1 | 4/2023 |

OTHER PUBLICATIONS

International Search Report and Written Opinion issued in PCT/IB2024/057914 mailed Dec. 16, 2024; 20 pgs.

Chang et al., "Broadband 1 Piezoelectric Transducers for Under-Display Ultrasonic Fingerprint Sensing," IEEE Transactions on Industrial Electronics, dated Apr. 28, 2020; 8 pgs.
Extended Search Report in Corresponding European Application No. 24826857.5, dated Sep. 23, 2025; 30 pgs.
Jiang et al., "Monolithic 1 ultrasound fingerprint sensor", Microsystems & Nanoengineering, vol. 3, No. 1, published Nov. 20, 2017; 8 pgs.
Lu, Yipeng, "Piezoelectric Micromachined 1 Ultrasonic Transducers for Fingerprint Sensing", PhD Thesis, University of California, dated May 2015; 162 pgs.
Notice of Grant in Corresponding Chinese Application No. 202311350805.4, dated Mar. 5, 2025; 11 pgs.
Tang, Hao-Yen, "Interface Electronics for 1 Ultrasonic Transducers," University of California at Berkeley, Technical Report No. UCB/EECS-2017-15, dated May 1, 2017; 76 pgs.
Xiong et al., "Global Patent Analysis of Ultrasonic Fingerprint Identification," China Inventions & Patents, vol. 16, No. 05, dated May 16, 2019; 14 pgs.

* cited by examiner 241      242

ULTRASONIC FINGERPRINT IDENTIFICATION APPARATUS AND LAMINATION THICKNESS ADJUSTMENT METHOD THEREFOR, AND ELECTRONIC DEVICE

RELATED APPLICATIONS

The present disclosure is a Continuation of International Application Number PCT/IB2024/057914 filed on Aug. 15, 2024, which claims the priority to Chinese Patent Application No. 202311350805.4, filed to the Chinese Patent Office on Oct. 17, 2023, and entitled "ULTRASONIC FINGERPRINT IDENTIFICATION APPARATUS AND LAMINATION THICKNESS ADJUSTMENT METHOD THEREFOR, AND ELECTRONIC DEVICE", which is incorporated in its entirety herein by reference.

TECHNICAL FIELD

The present disclosure relates to the technical field of fingerprint identification, and particularly relates to an ultrasonic fingerprint identification apparatus and a lamination thickness adjustment method therefor, and an electronic device.

BACKGROUND

Ultrasonic fingerprint identification is to transmit an ultrasonic signal to an application layer, and identify a fingerprint of a user according to an ultrasonic echo signal reflected after the user touches the application layer. The ultrasonic fingerprint identification has been widely used because a signal reflected by skin can be accurately identified by ultrasonic waves basically without being affected by various liquids and stains on a skin surface.

In an existing ultrasonic fingerprint identification apparatus, because of varied materials and molding methods of each lamination, a surface of the lamination is not completely flat, and there is various path interference in a transmission path of an ultrasonic echo signal, such as surface defects including bumps and pits. These problems result in background image defects such as speckles and block coverage in fingerprint imaging, which reduce accuracy of fingerprint identification.

SUMMARY

In view of that, embodiments of the present disclosure provide an ultrasonic fingerprint identification apparatus and a lamination thickness adjustment method therefor, and an electronic device, which can solve problems that there is interference in signal transmission paths in existing ultrasonic fingerprint identification, and the interference results in image defects of fingerprint imaging, which reduce accuracy of fingerprint identification.

In order to achieve the above objective, one aspect of the present disclosure provides an ultrasonic fingerprint identification apparatus. The ultrasonic fingerprint identification apparatus includes: an integrated chip and a piezoelectric transducer. A back surface of the integrated chip is connected to an application layer. The piezoelectric transducer is located on a surface of the integrated chip.

Through excitation of a driving pulse, the piezoelectric transducer transmits an ultrasonic signal to the application layer through the integrated chip, and a signal receiving circuit of the integrated chip receives an ultrasonic echo signal returned from a finger through the application layer.

Another aspect of the present disclosure provides an electronic device. The electronic device includes:

an application layer; and an ultrasonic fingerprint identification apparatus, which is used to identify a fingerprint of the application layer.

Yet another aspect of the present disclosure provides a lamination thickness adjustment method for an ultrasonic fingerprint identification apparatus. The method includes:

receiving a frequency adjustment request, wherein the frequency adjustment request includes a target working frequency, a thickness range of a transduction thickness of a piezoelectric transducer, a thickness range of a chip thickness of an integrated chip, and a thickness range of a total thickness of the transduction thickness and the chip thickness; and gradually adjusting the transduction thickness and/or the chip thickness in the thickness ranges according to a preset adjustment step size, and determining that a reflecting frequency of an ultrasonic echo signal of an application layer is equal to a target transduction thickness and/or a target chip thickness of the target working frequency.

According to one or more technical solutions provided in the embodiments of the present disclosure, the back surface of the integrated chip is directly bonded to the application layer, such that the ultrasonic echo signal returned from the application layer is directly received and processed by the signal receiving circuit of the integrated chip, and does not need to pass a plurality of laminations. In this way, technical effects of preventing image defects of fingerprint imaging caused by interference of lamination defects in signal propagation paths and improving accuracy of fingerprint identification can be achieved.

BRIEF DESCRIPTION OF DRAWINGS

More details, features and advantages of the present disclosure will be disclosed in the following description of illustrative examples in conjunction with the accompanying drawings. In the drawings.

DETAILED DESCRIPTION OF THE EMBODIMENTS

Embodiments of the present disclosure will be described in more detail below with reference to the accompanying drawings. Although some embodiments of the present disclosure are shown in the accompanying drawings, it should be understood that the present disclosure can be implemented in various forms and should not be construed as being limited to the examples illustrated herein. On the contrary, the embodiments are provided for a more thorough and complete understanding of the present disclosure. It should be understood that the drawings and the embodiments of the present disclosure are only for illustrative purposes, instead of limiting the protection scope of the present disclosure.

The terms "include" and "comprise" used herein and their variations are open-ended, that is, "include but not limited to" and "comprise but not limited to". The term "on the basis of" indicates "at least partly on the basis of". The term "one embodiment" indicates "at least one embodiment". The term "another embodiment" indicates "at least one another embodiment". Related definitions of other terms will be given in the following description. It should be noted that concepts such as "first" and "second" mentioned in the present disclosure are only used to distinguish different components, and are not used to limit an order or interdependence of functions executed by the components.

It should be noted that modifications with "a", "an" and "a plurality of" mentioned in the present disclosure are schematic rather than limitative, and should be understood by those skilled in the art as "one or more" unless otherwise definitely indicated in the context.

Names of messages or information exchanged among a plurality of components in embodiments of the present disclosure are merely used for illustration rather than limitation to the scope of the messages or information.

Bonding refers to a wire bonding method in a chip production process, and is used to connect a circuit to a package pin by means of a gold wire.

The solution of the present disclosure will be described below with reference to the accompanying drawings.

Figure 1:
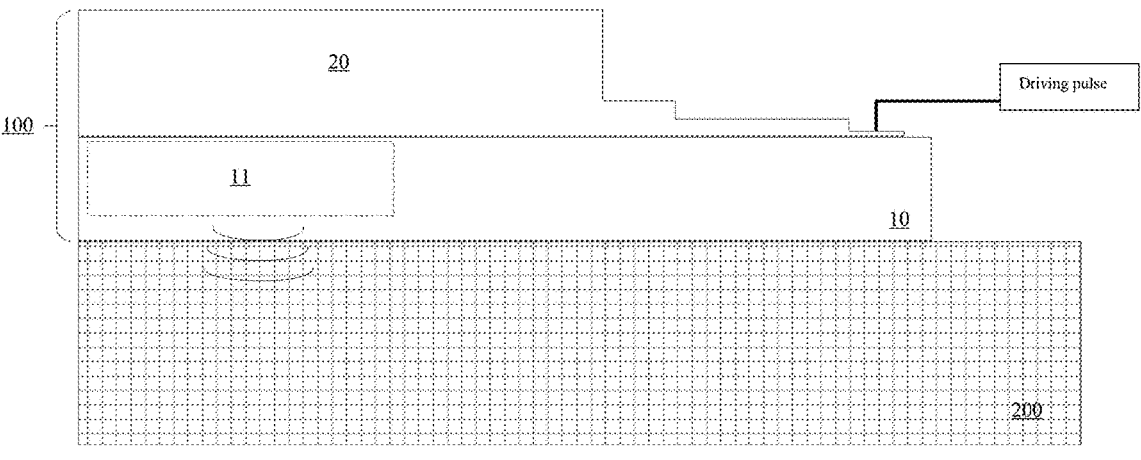
FIG. 1 shows a schematic diagram of an ultrasonic fingerprint identification apparatus according to an illustrative embodiment of the present disclosure.

FIG. 1 shows a schematic diagram of an ultrasonic fingerprint identification apparatus according to an illustrative embodiment of the present disclosure. As shown in FIG.

Figure 2:
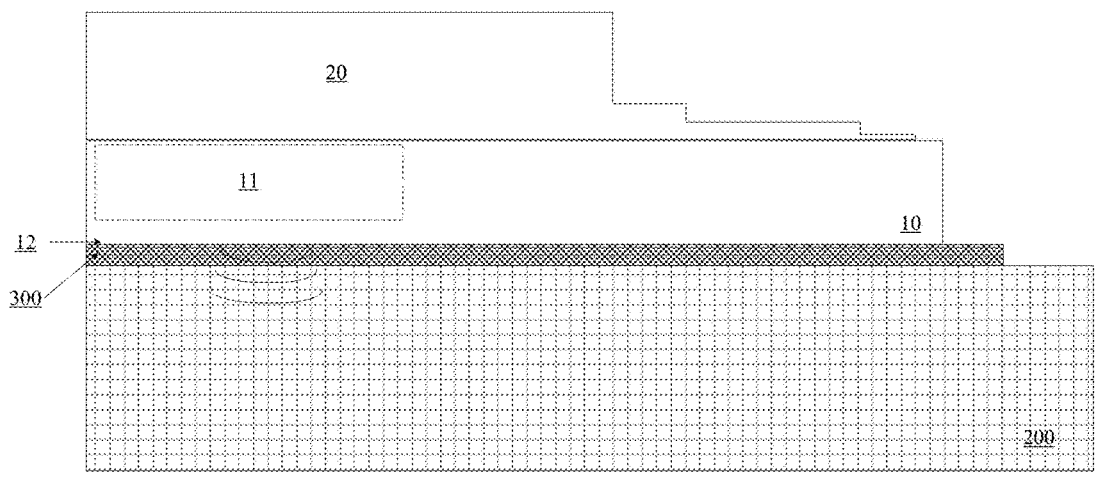
FIG. 2 shows a schematic bonding diagram of an integrated chip and an application layer according to an illustrative embodiment of the present disclosure.

1, the ultrasonic fingerprint identification apparatus 100 of the present disclosure includes: an integrated chip 10 and a piezoelectric transducer 20.

Wherein a back surface of the integrated chip 10 is connected to an application layer 200. The piezoelectric transducer 20 is located on a surface of the integrated chip 10. Through excitation of a driving pulse, the piezoelectric transducer 20 transmits an ultrasonic signal to the application layer 200 through the integrated chip 10, and a signal receiving circuit 11 of the integrated chip 10 receives an ultrasonic echo signal returned from a finger through the application layer 200. Specifically, further, as shown in FIG. 2, the material of the integrated chip 10 can be silicon. The back surface of the integrated chip 10 is connected to the application layer 200 by means of a first bonding layer 300. The back surface of the integrated chip 10 is a substrate 12 of the integrated chip 10. On one hand, the substrate may be polished to achieve flatness close to a mirror effect. When the substrate is connected to the application layer, a smooth flat surface of the substrate may abut against the application layer. Accordingly, when the ultrasonic echo signal is returned to the signal receiving circuit, the ultrasonic echo signal may be directly received by the signal receiving circuit without passing a plurality of traditional laminations. That is, interference of defects such as pits does not exist on a transmission path for the ultrasonic echo signal to return to the signal receiving circuit. In this way, a fingerprint imaging background of the ultrasonic echo signal is not interfered, definition of fingerprint imaging is effectively improved, and accuracy of fingerprint identification is improved. On the other hand, the first bonding layer may also be used as an acoustic impedance matching layer, so as to promote signal propagation.

Further, the integrated chip 10 is a complementary metal oxide semiconductor (CMOS) chip, such that simplification and miniaturization of the ultrasonic fingerprint identification apparatus are implemented while signal processing sensitivity is ensured.

Figure 3:
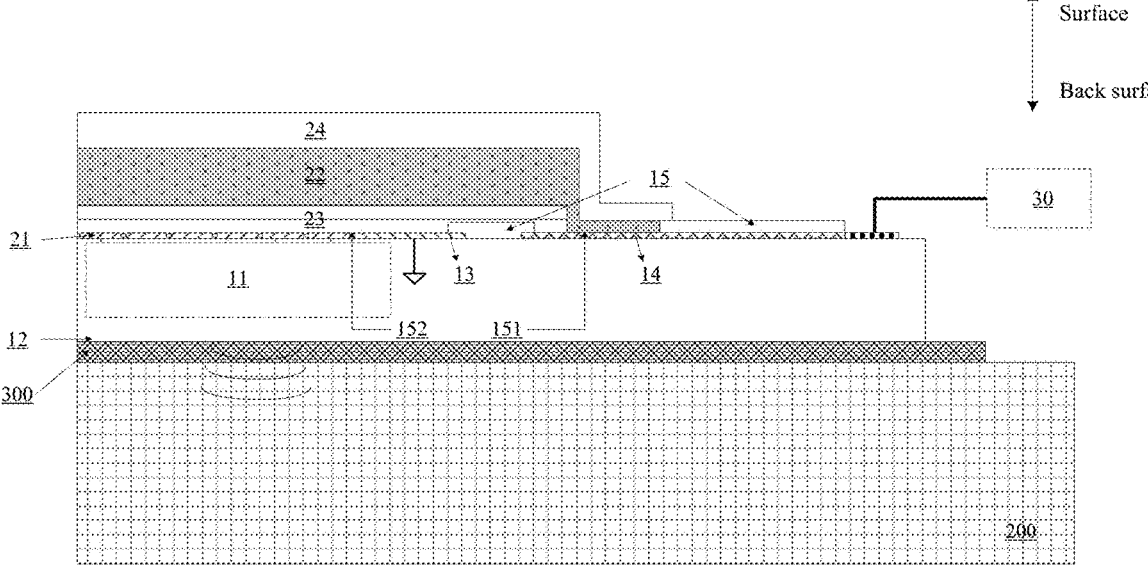
FIG. 3 shows a detailed diagram of an ultrasonic fingerprint identification apparatus according to an illustrative embodiment of the present disclosure.

In an embodiment of the present disclosure, as shown in FIG. 3, the piezoelectric transducer 20 includes a lower electrode 21 and an upper electrode 22 that are arranged on the surface of the integrated chip 10, and a piezoelectric layer 23 located between the lower electrode 21 and the upper electrode 22.

Figure 4:
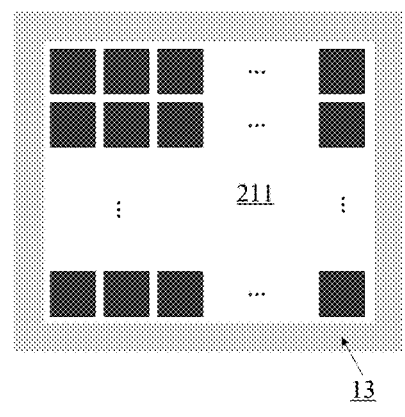
FIG. 4 shows a schematic diagram of an array mode of a lower electrode according to an illustrative embodiment of the present disclosure.
Figure 5:
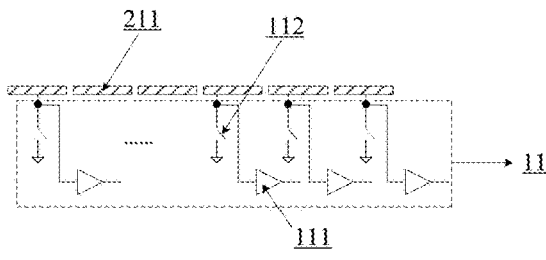
FIG. 5 shows a schematic diagram of a signal receiving circuit according to a first illustrative embodiment of the present disclosure.

In an embodiment of the present disclosure, the lower electrode 21 is electrically connected to the signal receiving circuit 11. The signal receiving circuit 11 receives the ultrasonic echo signal returned from the finger through the application layer 200 by the lower electrode 21. The lower electrode 21 may be an electrode array composed of a plurality of pixel electrodes 211 as shown in FIG. 4; and alternatively, the lower electrode 21 may be an entire electrode plate, which may be selectively set according to an actual identification environment. In a case that the lower electrode 21 is the electrode array, one pixel electrode 211 corresponds to one pixel point of fingerprint imaging, and each pixel electrode 211 receives an echo electric signal returned by different pixel points. As shown in FIG. 5, the signal receiving circuit 11 includes a plurality of receiving amplifiers 111 and a plurality of receiving switches 112, and the receiving amplifiers 111, the receiving switches 112 and the pixel electrodes 211 are in one-to-one correspondence. Each receiving amplifier 111 is connected to the corresponding pixel electrode 211. One end of each receiving switch 112 is connected to the corresponding pixel electrode 211, and the other end of the receiving switch 112 is grounded. The receiving switches 112 are used to control signal obtaining of the corresponding pixel electrodes 211. In a case that the receiving switch 112 is turned off, the corresponding receiving amplifier 111 collects echo electric signals of the pixel electrode 211. In a case that the receiving switch 112 is turned on, the corresponding receiving amplifier 111 does not collect echo electric signal of the pixel electrode 211. Therefore, by controlling an on-off sequence or on-off time of the receiving switches 112, a signal obtaining sequence of the corresponding pixel electrodes 211 may be controlled. For instance, synchronous receiving or sequential receiving is conducted.

Figure 6:
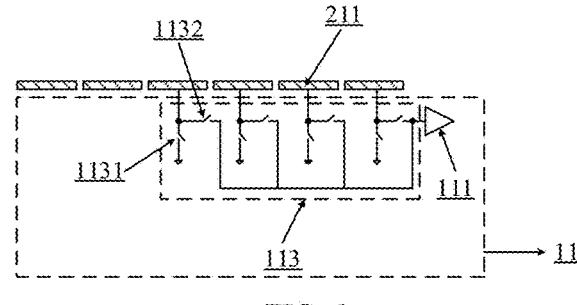
FIG. 6 shows a schematic diagram of a signal receiving circuit according to a second illustrative embodiment of the present disclosure.

Alternatively, as shown in FIG. 6, the signal receiving circuit 11 includes a plurality of switch groups 113 and a plurality of receiving amplifiers 111. Each of the switch groups 113 corresponds to one of the receiving amplifiers 111. Each of the switch groups 113 includes a plurality of first switches 1131 and a plurality of second switches 1132, the first switches 1131 are in one-to-one correspondence to the pixel electrodes 211, and the second switches 1132 are in one-to-one correspondence to the pixel electrodes 211. One end of each first switch 1131 is connected to the corresponding pixel electrode 211, and the other end of the first switch 1131 is grounded. One end of each second switch 1132 is connected to the corresponding pixel electrode 211, and the other end of the second switches 1132 is connected to the receiving amplifier 111 corresponding to the switch group 113. The first switches 1131 and the plurality of second switches 1132 are used to control signal obtaining of the corresponding pixel electrodes 211. In a case that the first switch 1131 is turned off and the second switch 1132 is turned on, the corresponding receiving amplifier 111 collect echo electric signals of the pixel electrode 211. In a case that the first switch 1131 is turned on and the second switch 1132 is turned off, the corresponding receiving amplifier 111 does not collect echo electric signal of the pixel electrode 211. Therefore, by controlling an on-off sequence or on-off time of the first switches 1131 and the second switches 1132, a signal obtaining sequence of the corresponding pixel electrodes 211 may be controlled. It should be noted that a number of the first switches and a number of the second switches in each of the switch groups may be selectively set as required. For instance, every 4 first switches and second switches are classified into one switch group, and correspond to a same receiving amplifier.

Further, the lower electrode 21 may be the entire electrode plate. Each of the receiving amplifiers 111 and each of the receiving switches 112 are directly connected to the electrode plate, and alternatively, each of the first switches 1131 and each of the second switches 1132 are directly connected to the electrode plate.

Further, the surface of the integrated chip 10 is further provided with a shielding electrode 13. As shown in FIGS. 3 and 4, the shielding electrode 13 is arranged around the lower electrode 21 to improve an uneven electric field in an edge zone of the lower electrode 21 and enhance sensitivity of signal transmitting and receiving in the edge zone of the lower electrode 21.

In an embodiment of the present disclosure, as shown in FIG. 3, the surface of the integrated chip 10 is provided with an upper electrode driving wire 14. The upper electrode driving wire 14 is electrically connected to the upper electrode 22 to receive the driving pulse and guide the driving pulse to the upper electrode 22.

Figure 7:
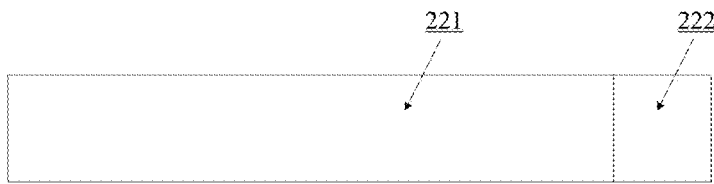
FIG. 7 shows a top view of an upper electrode according to an illustrative embodiment of the present disclosure.
Figure 8:
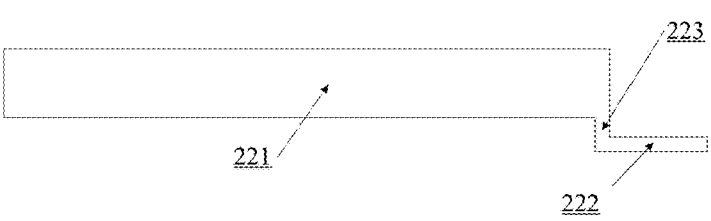
FIG. 8 shows a cutaway view of an upper electrode according to an illustrative embodiment of the present disclosure.

Further, as shown in FIGS. 7 and 8, a longitudinal section of the upper electrode 22 is step-shaped. The upper electrode 22 includes a first electrode platform 221 and a second electrode platform 222 parallel to the surface of the integrated chip 10, and a longitudinal electrode connecting part 223 that connects the first electrode platform 221 and the second electrode platform 222. The longitudinal electrode connecting part 223 is perpendicular to the surface of the integrated chip 10. The upper electrode driving wire 14 is electrically connected to the second electrode platform 222.

Further, a surface of the upper electrode driving wire 14 is covered with a passivation layer 15. The passivation layer 15 is provided with a first window 151. The upper electrode driving wire 14 is electrically connected to the second electrode platform 222 by the first window 151.

Further, the piezoelectric layer 23 is embedded in an accommodating cavity defined by the first electrode platform 221 and the longitudinal electrode connecting part 223. During transmission, after the upper electrode 22 receives the driving pulse, the piezoelectric layer 23 is excited, the piezoelectric layer 23 converts a driving electric signal of the driving pulse into a mechanical ultrasonic signal, and the ultrasonic signal is transmitted to the application layer 200 through the integrated chip 10. During reception, a user touches the application layer 200 with a finger, the ultrasonic echo signal is returned from the application layer 200, the mechanical ultrasonic echo signal is transmitted to the piezoelectric layer 23, the piezoelectric layer 23 converts the ultrasonic echo signal into the echo electric signal, and the echo electric signal is received by the upper electrode 22 and the lower electrode 21 and then transmitted to the signal receiving circuit 11, such that the integrated chip 10 processes the echo electric signal so as to identify the fingerprint of the user.

Further, the piezoelectric layer 23 may be made of a piezoelectric polymer material with a piezoelectric effect, such as polyvinylidene difluoride (PVDF) and polyvinylidene difluoride-trifluoroethylene (PVDF-TrFE). The upper electrode 22 may be made of silver paste. When the upper electrode 22 is machined, a silver paste coating made of silver powder and glue may be directly applied to a surface of the piezoelectric layer 23.

In an embodiment of the present disclosure, as shown in FIG. 3, the piezoelectric transducer 20 further includes a protective layer 24. The protective layer 24 covers a surface of the upper electrode 22, may be made of a semiconductor material such as gallium arsenide and aluminum, and is used to protect the upper electrode 22, such that damages such as friction and pressure on the surface of the upper electrode 22 are avoided, and smooth reception and processing of signals of the upper electrode 22 are ensured.

Figure 9:
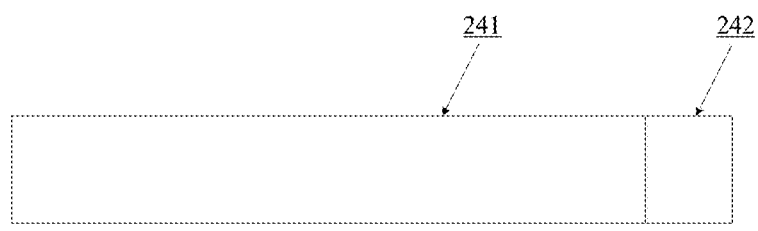
FIG. 9 shows a top view of a protective layer according to an illustrative example of the present disclosure.
Figure 10:
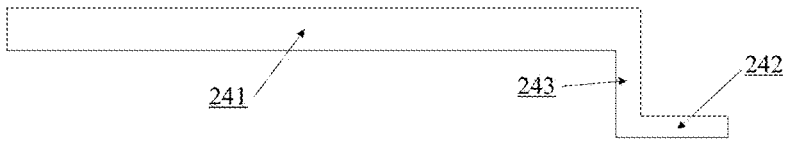
FIG. 10 shows a cutaway view of a protective layer according to an illustrative embodiment of the present disclosure.

Further, as shown in FIGS. 9 and 10, a longitudinal section of the protective layer 24 is also step-shaped. The protective layer 24 includes a first protective platform 241 and a second protective platform 242 parallel to the surface of the integrated chip 10, and a longitudinal protective connecting part 243 that connects the first protective platform 241 and the second protective platform 242. The longitudinal protective connecting part 243 is perpendicular to the surface of the integrated chip 10.

In an embodiment of the present disclosure, as shown in FIG. 3, the ultrasonic fingerprint identification apparatus 100 includes a driving circuit 30. The driving circuit 30 is electrically connected to the upper electrode 22 of the piezoelectric transducer 20 by the upper electrode driving wire 14 arranged on the surface of the integrated chip 10, so as to transmit the driving pulse to the piezoelectric transducer 20.

Figure 11:
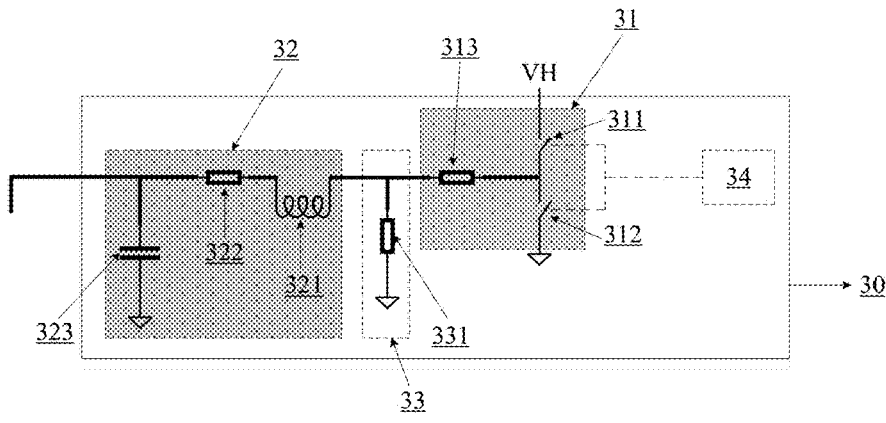
FIG. 11 shows a schematic diagram of a driving circuit according to an illustrative embodiment of the present disclosure.

Further, as shown in FIG. 11, the driving circuit 30 includes a driver 31, a resonant circuit 32, and a braking circuit 33. The driver 31 includes a driving switch 311, a grounding switch 312, and a driving resistor 313. One end of the driving switch 311 is connected to a driving power supply (a driving voltage of which is denoted as VH), and the other end of the driving switch 311 is connected to the driving resistor 313. One end of the grounding switch 312 is grounded, and the other end of the grounding switch 312 is connected to one side, connected to the driving switch 311, of the driving resistor 313. The resonant circuit 32 includes an inductor 321, an equivalent resistor 322, and a capacitor 323, and which is used to perform resonant processing on a pulse emitted by the driver 31, such that the driving circuit 30 outputs the driving pulse. One end of the inductor 321 is connected to one side of the driving resistor 313 away from the driving switch 311, and the other end of the inductor 321 is connected to the equivalent resistor 322. The side of the equivalent resistor 322 away from the inductor 321 is connected to the capacitor 323. The end of the capacitor 323 away from the equivalent resistor 322 is grounded. The driving pulse is output between the equivalent resistor 322 and the capacitor 323. The braking circuit 33 includes a damping resistor 331, which is used to absorb residual vibration energy of the resonant circuit 32, such that the resonant circuit 32 quickly returns to zero. One end of the damping resistor 331 is connected between the driving resistor 313 and the inductor 321, and the other end of the damping resistor 331 is grounded.

Further, the driving circuit 30 further includes a control circuit 34. The control circuit 34 may be arranged on the integrated chip 10 or in another environmental structure of a specific application scene of the ultrasonic fingerprint identification apparatus 100, and is configured to transmit a first control signal and a second control signal to the driving switch 311 and the grounding switch 312 respectively. The first control signal controls the driving switch 311 to be turned on and off, and the second control signal controls the grounding switch 312 to be turned on and off. When the first control signal and the second control signal control the driving switch 311 and the grounding switch 312 respectively to be turned on and off alternately, a square wave pulse can be generated. The resonant circuit 32 conducts resonating on the square wave pulse generated by the driver 31, such that the driving circuit 30 outputs a sinusoidal pulse with a resonant frequency as the target working frequency $f_s$.

Figure 12:
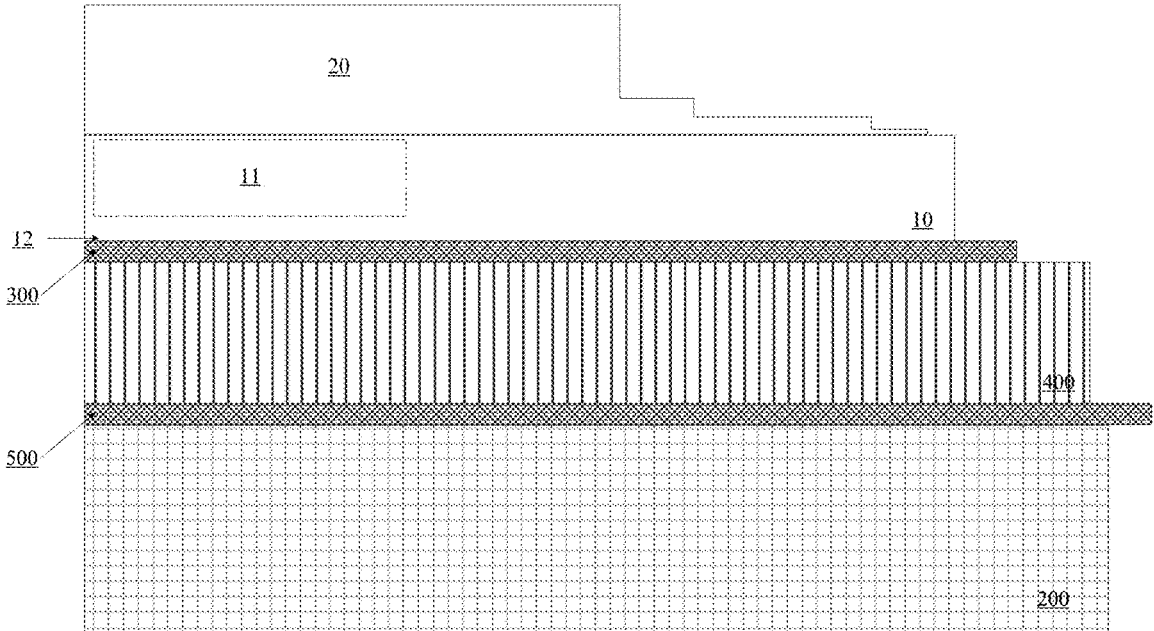
FIG. 12 shows a schematic diagram of an ultrasonic fingerprint identification apparatus according to another illustrative embodiment of the present disclosure.

In another embodiment of the present disclosure, as shown in FIG. 12, a supporting layer 400 is further arranged between the back surface of the integrated chip 10 and the application layer 200, and is configured to support the integrated chip 10, such that stability of the ultrasonic fingerprint identification apparatus is enhanced.

Further, the supporting layer 400 may be used as a wave guiding layer configured to conduct impedance matching on a signal, so as to enhance conduction of a signal.

Further, the supporting layer 400 is bonded to the back surface of the integrated chip 10 by a first bonding layer 300 and bonded to the application layer 200 by a second bonding layer 500.

In an embodiment of the present disclosure, as shown in FIG. 3, the ultrasonic fingerprint identification apparatus 100 includes the integrated chip 10, the piezoelectric transducer 20, and the driving circuit 30. The back surface of the integrated chip 10 is connected to the application layer 200.

The piezoelectric transducer 20 is located on the surface of the integrated chip 10. The driving circuit 30 is electrically connected to the piezoelectric transducer 20, so as to transmit the driving pulse to the piezoelectric transducer 20. Through excitation of the driving pulse, the piezoelectric transducer 20 transmits the ultrasonic signal to the application layer 200 through the integrated chip 10, and then the integrated chip 10 receives the ultrasonic echo signal returned from the finger through the application layer 200. Specifically:

The integrated chip 10 includes the signal receiving circuit 11, the substrate 12, the shielding electrode 13, the upper electrode driving wire 14, and the passivation layer 15. The piezoelectric transducer 20 includes the lower electrode 21, the upper electrode 22, the piezoelectric layer 23, and the protective layer 24. The driving circuit 30 includes the driver 31, the resonant circuit 32, the braking circuit 33, and the control circuit 34.

The substrate 12 of the integrated chip 10 is bonded to the application layer 200 by the first bonding layer 300. The lower electrode 21 is arranged on the surface of the integrated chip 10 and electrically connected to the signal receiving circuit 11 of the integrated chip 10. The shielding electrode 13 and the upper electrode driving wire 14 are also arranged on the surface of the integrated chip 10. The shielding electrode 13 is arranged around the lower electrode 21. A combination of the lower electrode 21, the shielding electrode 13 and the upper electrode driving wire 14 may be referred to as a top metal layer. The upper electrode driving wire 14 is configured to be electrically connected to the upper electrode 22 arranged on the lower electrode 21. One end of the upper electrode driving wire 14 is fixed to the integrated chip 10 through a bonding process, so as to be connected to the driving circuit 30 and receive the driving pulse transmitted by the driving circuit 30. The piezoelectric layer 23 is located between the lower electrode 21 and the upper electrode 22. The protective layer 24 covers the surface of the upper electrode 22.

The upper electrode 22 includes the first electrode platform 221, the second electrode platform 222, and the longitudinal electrode connecting part 223. The piezoelectric layer 23 is embedded in the accommodating cavity defined by the first electrode platform 221 and the longitudinal electrode connecting part 223. The passivation layer 15 covers a surface of the top metal layer, and is configured to reduce wear or corrosion phenomena such as friction and compression of the top metal layer. As shown in FIG. 3, a zone, corresponding to the upper electrode driving wire 14, of the passivation layer 15 is provided with the first window 151, such that the upper electrode driving wire 14 is electrically connected to the second electrode platform 222 extending out of the piezoelectric layer 23 from the upper electrode 22 by the first window 151. A zone, corresponding to the lower electrode 21 and the shielding electrode 13, of the passivation layer 15 is provided with a second window 152, and the second window 152 is configured to ensure electrical connection between the piezoelectric layer 23, the lower electrode 21 and the shielding electrode 13.

The lower electrode 21 is the electrode array composed of the plurality of pixel electrodes 211. Each of the pixel electrodes 211 corresponds to a pixel point of fingerprint imaging, and each of the pixel electrodes 211 receives the echo electric signal returned by different pixel points. The signal receiving circuit 11 is electrically connected to the lower electrode 21, receives the echo electric signal by the lower electrode 21, and includes the plurality of receiving amplifiers 111 and the plurality of receiving switches 112.

The receiving amplifiers 111, the receiving switches 112 and the pixel electrodes 211 are in one-to-one correspondence. Each receiving amplifier 111 is connected to the corresponding pixel electrode 211. One end of each receiving switch 112 is connected to the corresponding pixel electrode 211, and the other end of the receiving switch 112 is grounded.

The driving circuit 30 includes the driver 31, the resonant circuit 32, the braking circuit 33, and the control circuit 34. The driver 31 includes the driving switch 311, the grounding switch 312, and the driving resistor 313. One end of the driving switch 311 is connected to the driving power supply, and the other end of the driving switch 311 is connected to the driving resistor 313. One end of the grounding switch 312 is grounded, and the other end of the grounding switch 312 is connected to one side, connected to the driving switch 311, of the driving resistor 313. The resonant circuit 32 includes the inductor 321, the equivalent resistor 322, and the capacitor 323. One end of the inductor 321 is connected to one side of the driving resistor 313 away from the driving switch 311, and the other end of the inductor 321 is connected to the equivalent resistor 322. One side of the equivalent resistor 322 away from the inductor 321 is connected to the capacitor 323. One end of the capacitor 323 away from the equivalent resistor 322 is grounded. The braking circuit 33 includes the damping resistor 331. One end of the damping resistor 331 is connected between the driving resistor 313 and the inductor 321, and the other end of the damping resistor 331 is grounded. The control circuit 34 is configured to transmit the first control signal and the second control signal to the driving switch 311 and the grounding switch 312 respectively, so as to control the driving switch 311 and the grounding switch 312 to be turned on and off.

In an embodiment of the present disclosure, in a transmitting mode, the receiving switch 112 of the signal receiving circuit 11 is turned on. When the control circuit 34 controls the driving switch 311 and the grounding switch 312 through the first control signal and the second control signal respectively to be turned on and off alternately, the square wave pulse is generated by the driver 31. The resonant circuit 32 conducts resonating on the square wave pulse, and the driving circuit 30 outputs the sinusoidal pulse with the resonant frequency as the target working frequency $f_s$ between the equivalent resistor 322 and the capacitor 323. The sinusoidal pulse is loaded to the upper electrode 22 by the upper electrode driving wire 14, and the piezoelectric layer 23 is excited to conduct mechanical movement so as to generate the ultrasonic signal. The ultrasonic signal is transmitted to the application layer 200 through the integrated chip 10.

When the user touches the application layer 200 with the finger, a receiving mode is switched to. In this case, the receiving switch 112 of the signal receiving circuit 11 is turned off, and the control circuit 34 controls the driving switch 311 and the grounding switch 312 to be turned off, such that the driving resistor 313 is in a high-resistance state. The mechanical ultrasonic echo signal returned from the application layer 200 is transmitted to the piezoelectric layer 23 and is converted into the echo electric signal. After the echo electric signal is received by the upper electrode 22 and the lower electrode 21, the echo electric signal is collected by the receiving amplifier 111 and processed by the integrated chip 10, and then a fingerprint image is generated.

Further, in the transmitting mode, the plurality of receiving switches 112 do not need to be turned on simultaneously, and an order of turning on each receiving switch 112 may be selected according to an actual identification scene and a pixel point position corresponding to the pixel electrode 211. In the receiving mode, the plurality of receiving switches 112 do not need to be turned off simultaneously, and an order of turning off each receiving switch 112 may be selected according to an actual identification scene and a pixel point position corresponding to the pixel electrode 211.

In the prior art, an ultrasonic echo signal needs to pass a protective layer, an upper electrode and other laminations before reaching a piezoelectric layer, and due to an incompletely smooth flat surface of each lamination, interference in backgrounds of fingerprint imaging is likely to be caused because of raised pinholes and depressions on the surfaces. Compared with that, in the embodiment of the present disclosure, according to the ultrasonic fingerprint identification apparatus of the present disclosure, the ultrasonic signal is transmitted to the application layer through the substrate on the back surface of the integrated chip, the ultrasonic echo signal returned from the application layer directly reaches the piezoelectric layer by only passing the integrated chip without other laminations, and the integrated chip has a smooth flat surface, such that no imaging interference of surface defects exists in the ultrasonic echo signal, definition of fingerprint imaging is improved, thus improving identification accuracy of fingerprint imaging.

Figure 13:
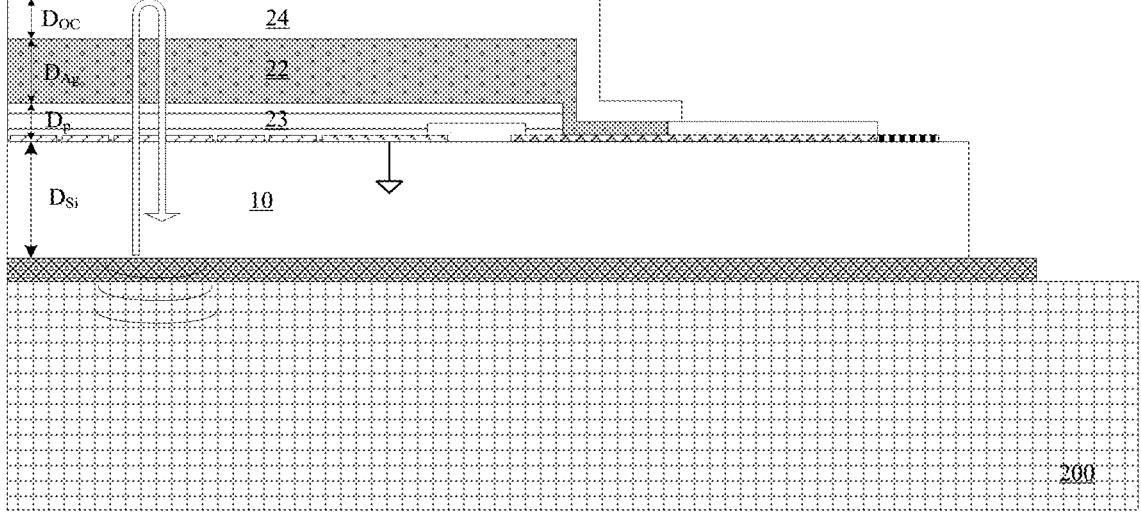
FIG. 13 shows a schematic diagram of a reflecting path of an ultrasonic echo signal according to an illustrative embodiment of the present disclosure.
Figure 14:
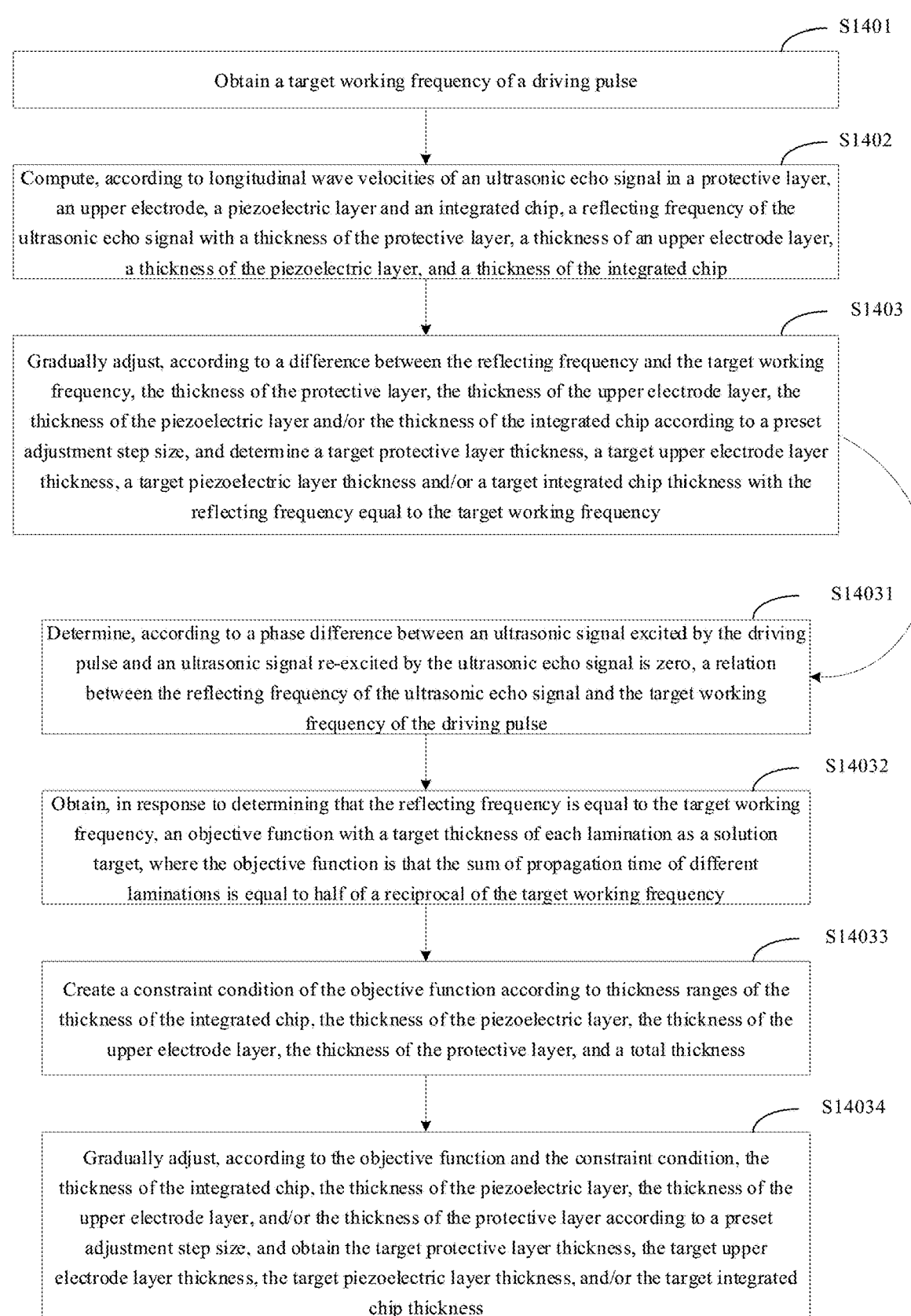
FIG. 14 shows a flow diagram of a lamination thickness adjustment method for an ultrasonic fingerprint identification apparatus according to an illustrative embodiment of the present disclosure.

In an embodiment of the present disclosure, in actual use of the ultrasonic fingerprint identification apparatus, the ultrasonic signal excited by the piezoelectric layer 23 is a longitudinal wave signal. The longitudinal wave signal is transmitted in a direction from the surface to the back surface of the integrated chip 10, and transmitted to the application layer 200 through the integrated chip 10. In response to a touch operation by the finger of the user, the ultrasonic echo signal returned from the application layer 200 is transmitted along the path as shown in FIG. 13, passes the integrated chip 10, the piezoelectric layer 23, the upper electrode 22 and the protective layer 24, and then reversely returns along the protective layer 24, the upper electrode 22, the piezoelectric layer 23, and the integrated chip 10. In order to ensure that a reflecting frequency of the ultrasonic echo signal reaches a target working frequency $f_s$ of a use scene, as shown in FIG. 14, the present disclosure enables the reflecting frequency to reach the target working frequency $f_s$ by adjusting lamination thicknesses of the integrated chip 10, the piezoelectric layer 23, the upper electrode 22, and the protective layer 24. A lamination thickness adjustment method for the ultrasonic fingerprint identification apparatus of the present disclosure includes the following steps:

S1401, a target working frequency of a driving pulse is obtained.

S1402, according to longitudinal wave velocities of an ultrasonic echo signal in a protective layer, an upper electrode, a piezoelectric layer and an integrated chip, a reflecting frequency of the ultrasonic echo signal is computed with a thickness of the protective layer, a thickness of an upper electrode layer, a thickness of the piezoelectric layer, and a thickness of the integrated chip.

In an embodiment of the present disclosure, the ultrasonic echo signal returned from the finger through the application layer 200 passes the integrated chip 10, the piezoelectric layer 23, the upper electrode 22 and the protective layer 24, and then reversely returns along the protective layer 24, the upper electrode 22, the piezoelectric layer 23, and the integrated chip 10. The reflecting frequency is determined on the basis of reflecting time for the ultrasonic echo signal to pass each lamination. A lamination thickness of each lamination may be determined according to a difference between the target working frequency and the reflecting frequency. Specifically, according to a transmission path of the ultrasonic echo signal, the reflecting time of the ultrasonic echo signal is determined, such that the reflecting frequency is obtained.

In an embodiment of the present disclosure, when a folded ultrasonic echo signal passes the piezoelectric layer 23 and is used as a re-excited ultrasonic signal to be transmitted to the application layer 200, the signal and an initial ultrasonic signal excited by a sinusoidal pulse output by a driving circuit 30 through the piezoelectric layer 23 may be superimposed. Therefore, in order to ensure that the energy of the ultrasonic signal after superposition is maximum, that is, in order to enable a phase difference between the ultrasonic signal excited by the driving pulse and the ultrasonic signal re-excited by the ultrasonic echo signal to be zero, and ensure an optimal energy intensity, to improve a signal transmission intensity. The reflecting time ta of the ultrasonic echo signal is shown in the following formula (1):

$$t_d = 2 \cdot \left( \frac{D_{Si}}{u_{Si}} + \frac{D_p}{u_p} + \frac{D_{Ag}}{u_{Ag}} + \frac{D_{OC}}{u_{OC}} \right) \tag{1}$$

In the Formula:

$D_{Si}$ denotes the thickness of the integrated chip 10, and $u_{Si}$ denotes a longitudinal wave velocity of the ultrasonic signal transmitted in the integrated chip 10; $D_p$ denotes the thickness of the piezoelectric layer 23, and $u_p$ denotes a longitudinal wave velocity of the ultrasonic signal transmitted in the piezoelectric layer 23; $D_{Ag}$ denotes the thickness of the upper electrode layer of the upper electrode 22, and $u_{Ag}$ denotes a longitudinal wave velocity of the ultrasonic signal transmitted in the upper electrode 22; and $D_{OC}$ denotes the thickness of the protective layer 24, and $u_{OC}$ denotes a longitudinal wave velocity of the ultrasonic signal transmitted in the protective layer 24.

Further, the reflecting frequency $f_d$ of the ultrasonic echo signal is a reciprocal of the reflecting time $t_d$, that is $$\frac{1}{f_d} = t_d. \tag{45}$$

S1403, according to a difference between the reflecting frequency and the target working frequency, the thickness of the protective layer, the thickness of the upper electrode layer, the thickness of the piezoelectric layer and/or the thickness of the integrated chip are gradually adjusted according to a preset adjustment step size, and a target protective layer thickness, a target upper electrode layer thickness, a target piezoelectric layer thickness and/or a target integrated chip thickness with the reflecting frequency equal to the target working frequency are determined.

S14031, according to a phase difference between an ultrasonic signal excited by the driving pulse and an ultrasonic signal re-excited by the ultrasonic echo signal is zero, a relation between the reflecting frequency of the ultrasonic echo signal and the target working frequency of the driving pulse is determined.

In an embodiment of the present disclosure, the phase difference between the ultrasonic signal excited by the driving pulse and the ultrasonic signal re-excited by the ultrasonic echo signal is zero. That is, the reflecting time $t_d$ of the ultrasonic echo signal is an integral multiple of a pulse period $T_s$ of the driving pulse, as shown in the following formula (2):

$$t_d = n T_s, \quad n = 1, 2, \dots, N \tag{2}$$

The pulse period $T_s$ of the driving pulse is a reciprocal of the target working frequency $f_s$ of the driving pulse, that is $$T_s = \frac{1}{f_s},$$

which is put into the formula (1) together with the formula (2), as shown in the following formula (3):

$$t_d = 2 \cdot \left( \frac{D_{Si}}{u_{Si}} + \frac{D_p}{u_p} + \frac{D_{Ag}}{u_{Ag}} + \frac{D_{OC}}{u_{OC}} \right) = n T_s = \frac{n}{f_s} \tag{3}$$

By putting elements into the formula (3), the relation between the reflecting frequency $f_d$ of the ultrasonic echo signal and the target working frequency $f_s$ of the driving pulse may be obtained, as shown in the following formula (4):

$$\frac{1}{f_s} = 2 \cdot \left( \frac{D_{Si}}{u_{Si}} + \frac{D_p}{u_p} + \frac{D_{Ag}}{u_{Ag}} + \frac{D_{OC}}{u_{OC}} \right) = \frac{n}{f_s} \tag{4}$$

In the formula, for instance, longitudinal wave velocities of the ultrasonic signal in various materials are as follows:

a longitudinal wave velocity of the ultrasonic signal in organic glass is 2.73 um/ns, that of the ultrasonic signal in copper is 4.7 um/ns, that of the ultrasonic signal in steel is 5.9 um/ns, that of the ultrasonic signal in aluminum is 6.3 um/ns, that of the ultrasonic signal in beryllium is 12.9 um/ns, that of the ultrasonic signal in gold is 3.2 um/ns, that of the ultrasonic signal in iron is 5.9 um/ns, that of the ultrasonic signal in iron-nickel-chromium alloy is 5.7 um/ns, that of the ultrasonic signal in lead is 2.2 um/ns, that of the ultrasonic signal in nickel is 5.6 um/ns, that of the ultrasonic signal in polystyrene is 2.4 um/ns, that of the ultrasonic signal in polyethylene is 1.9 um/ns, that of the ultrasonic signal in rubber is 1.8 um/ns, that of the ultrasonic signal in tin is 3.3 um/ns, that of the ultrasonic signal in titanium is 6.1 um/ns, that of the ultrasonic signal in polyvinylidene fluoride (PVDF) is 2.2 um/ns, that of the ultrasonic signal in silicon (Si) is 2.33 um/ns, that of the ultrasonic signal in silver paste is 1.5 um/ns-2.5 um/ns, that of the ultrasonic signal in polyvinyl chloride (PVC) is 2.39 um/ns, that of the ultrasonic signal in polypropylene (PP) is 2.1 um/ns, that of the ultrasonic signal in perfluoroalkoxy alkane (PFA) is 1.23 um/ns, and that of the ultrasonic signal in acrylonitrile butadiene styrene is 2.25 um/ns.

S14032, in response to determining that the reflecting frequency is equal to the target working frequency, an objective function with a target thickness of each lamination as a solution target is obtained, where the objective function is that the sum of propagation time of different laminations is equal to half of the reciprocal of the target working frequency.

In an embodiment of the present disclosure, the closer the reflecting frequency $f_d$ of the ultrasonic signal re-excited by the ultrasonic echo signal is to the target working frequency $f_s$ of the driving pulse, the higher a superposition effect is. As seen from the formula (4), the highest superposition effect is achieved when n=1. Therefore, in order to achieve the highest superposition effect, with the reflecting frequency $f_d$ equal to the target working frequency $f_s$ when n=1 as a target, the objective function obtained is shown in the following formula (5):

$$\frac{1}{f_s} = 2 \cdot \left( \frac{D_{Si}}{u_{Si}} + \frac{D_p}{u_p} + \frac{D_{Ag}}{u_{Ag}} + \frac{D_{OC}}{u_{OC}} \right) \quad (5)$$

The formula (5) indicates that the sum of the propagation time of different laminations is equal to half of the reciprocal of the target working frequency.

S14033, a constraint condition of the objective function is created according to thickness ranges of the thickness of the integrated chip, the thickness of the piezoelectric layer, the thickness of the upper electrode layer, the thickness of the protective layer, and a total thickness.

In an embodiment of the present disclosure, as seen from the formula (5), the longitudinal wave velocity of the ultrasonic signal in the lamination is constant, so the present disclosure satisfies a requirement of achieving the target working frequency $f_s$ by adjusting the thickness of each lamination. However, due to different materials and machining technologies, the thickness range of the thickness of each lamination is limited, and the constraint condition is as shown in the following formula (6):

$$D_{Si,min} \leq D_{Si} \leq D_{Si,max} \quad (6)$$

$$D_{p,min} \leq D_p \leq D_{p,max}$$

$$D_{Ag,min} \leq D_{Ag} \leq D_{Ag,max}$$

$$D_{OC,min} \leq D_{OC} \leq D_{OC,max}$$

An application scene of the ultrasonic fingerprint identification apparatus also has restrictions on an apparatus thickness of the entire apparatus, so the constraint condition of the total thickness of each lamination is shown in the following formula (7):

$$D_{Si} + D_p + D_{Ag} + D_{OC} = D_{sum} \leq D_{sum,max} \quad (7)$$

S14034, according to the objective function and the constraint condition, the thickness of the integrated chip, the thickness of the piezoelectric layer, the thickness of the upper electrode layer, and/or the thickness of the protective layer are gradually adjusted according to a preset adjustment step size, and the target protective layer thickness, the target upper electrode layer thickness, the target piezoelectric layer thickness, and/or the target integrated chip thickness are obtained.

In an embodiment of the present disclosure, under the constraint conditions of the formulas (6)-(7), at least one of the thickness of the integrated chip, the thickness of the piezoelectric layer, the thickness of the upper electrode layer and/or the thickness of the protective layer in the objective function of the formula (5) is adjusted, such that the target protective layer thickness, the target upper electrode layer thickness, the target piezoelectric layer thickness and/or the target integrated chip thickness are obtained.

Figure 15:
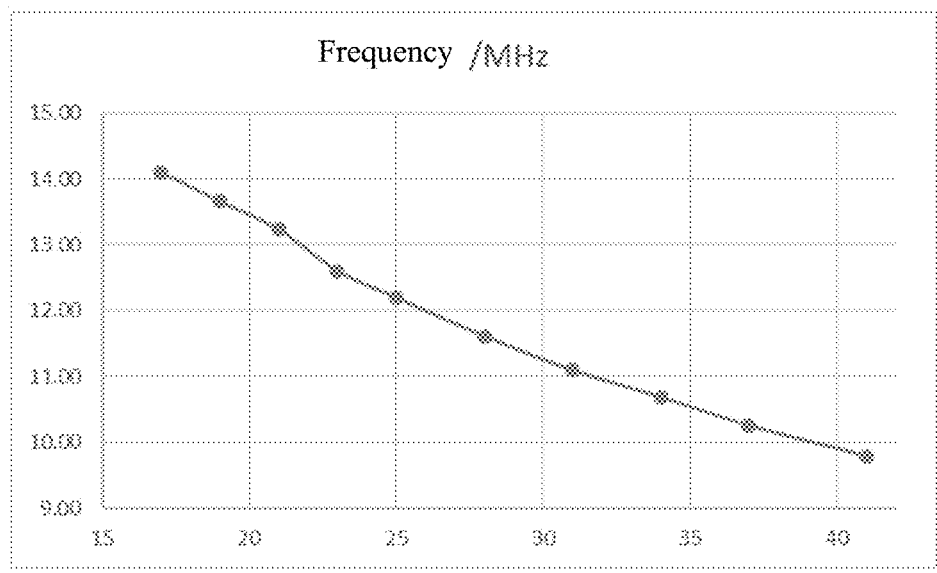
FIG. 15 shows a tendency chart of changes of a reflecting frequency with an upper electrode layer thickness according to an illustrative embodiment of the present disclosure.

Further, illustration is conducted with a case that $D_{Si}$=110 um, $D_p$=9 μm and $D_{OC}$=9 um while the thickness $D_{Ag}$ of the upper electrode layer is adjusted as an instance. As shown in FIG. 15, abscissas indicate the thickness $D_{Ag}$ (um) of the upper electrode layer, and ordinates indicate the reflecting frequency $f_d$ (MHz). As seen from FIG. 15, with increase in the thickness $D_{Ag}$ of the upper electrode layer, the reflecting frequency $f_d$ gradually decreases. When the target working frequency $f_s$ is 13 MHZ, the target upper electrode layer thickness is 22 um.

Further, similarly, by adjusting (1) the thickness of the integrated chip, (2) the thickness of the piezoelectric layer, (3) the thickness of the protective layer, (4) the thickness of the integrated chip and the thickness of the piezoelectric layer, (5) the thickness of the integrated chip and the thickness of the upper electrode layer, (6) the thickness of the integrated chip and the thickness of the protective layer, (7) the thickness of the piezoelectric layer and the thickness of the upper electrode layer, (8) the thickness of the piezoelectric layer and the thickness of the protective layer, (9) the thickness of the upper electrode layer and the thickness of the protective layer, (10) the thickness of the integrated chip, the thickness of the piezoelectric layer and the thickness of the upper electrode layer, (11) the thickness of the integrated chip, the thickness of the piezoelectric layer and the thickness of the protective layer, (12) the thickness of the integrated chip, the thickness of the upper electrode layer and the thickness of the protective layer, (13) the thickness of the piezoelectric layer, the thickness of the upper electrode layer and the thickness of the protective layer, or (14) the thickness of the integrated chip, the thickness of the piezoelectric layer, the thickness of the upper electrode layer and the thickness of the protective layer, the reflecting frequency is enabled to be equal to the target working frequency.

In an embodiment of the present disclosure, alternatively, the objective function of the formula (5) may be adaptively changed according to different laminations of the ultrasonic fingerprint identification apparatus. For instance, the ultrasonic fingerprint identification apparatus shown in FIG. 12 further includes a supporting layer 400 configured to conduct impedance matching on the ultrasonic echo signal. Meanwhile, the transmission path of the ultrasonic echo signal is enlarged, the reflecting time of the ultrasonic echo signal is prolonged, interference between the ultrasonic signal excited by the driving pulse and the ultrasonic signal re-excited by the ultrasonic echo signal is reduced, a signal propagation intensity is improved, and stability of fingerprint imaging is enhanced. Further, accuracy of fingerprint identification is ensured. Accordingly, a reflecting path of the ultrasonic echo signal further includes the supporting layer 400. The objective function is as shown in the following formula (8):

$$\frac{1}{f_s} = 2 \cdot \left( \frac{D_{Si}}{u_{Si}} + \frac{D_p}{u_p} + \frac{D_{Ag}}{u_{Ag}} + \frac{D_{OC}}{u_{OC}} + \frac{D_{wg}}{u_{wg}} \right) \quad (8)$$

In the Formula:

$D_{wg}$ denotes a support thickness of the supporting layer 400, and $u_{wg}$ denotes a longitudinal wave velocity of the ultrasonic signal transmitted in the supporting layer 400.

In an embodiment of the present disclosure, alternatively, according to whether the lamination thickness of the ultrasonic fingerprint identification apparatus is fixed or not, the objective function of the formula (5) may be adaptively changed. For instance, the thickness $D_{Si}$ of the integrated chip 10 is fixed to be a known constant. The objective function is as shown in the following formula (9):

$$\frac{1}{f_s} = 2 \cdot \left( C_1 + \frac{D_p}{u_p} + \frac{D_{Ag}}{u_{Ag}} + \frac{D_{OC}}{u_{OC}} \right) \qquad (9)$$

Further, for instance, the thickness $D_{Si}$ of the integrated chip 10 and the thickness $D_p$ of the piezoelectric layer 23 are fixed to be known constants. The objective function is as shown in the following formula (10):

$$\frac{1}{f_s} = 2 \cdot \left( C_2 + \frac{D_{Ag}}{u_{Ag}} + \frac{D_{OC}}{u_{OC}} \right) \qquad (10)$$

Further, for instance, the thickness $D_{Si}$ of the integrated chip 10, the thickness $D_p$ of the piezoelectric layer 23 and the thickness $D_{OC}$ of the protective layer 24 are fixed to be known constants. The objective function is as shown in the following formula (11):

$$\frac{1}{f_s} = 2 \cdot \left( C_3 + \frac{D_{Ag}}{u_{Ag}} + \frac{D_{AG}}{u_{Ag}} \right) \qquad (11)$$

The rest may be done in the same manner.

In an embodiment of the present disclosure, through the lamination thickness adjustment method for the ultrasonic fingerprint identification apparatus according to the present disclosure, the thickness of each lamination may be adjusted, to determine an optimal target lamination thickness satisfying the target working frequency. In this way, a signal superposition effect is optimized, signal superposition energy is maximized, definition of fingerprint imaging is improved, and accuracy of fingerprint identification is enhanced.

An illustrative embodiment of the present disclosure further provides an electronic device. The electronic device includes: an application layer; and an ultrasonic fingerprint identification apparatus, which is configured to identify a fingerprint of the application layer. For the illustrative purpose rather than the limitative purpose, the electronic device in the example of the present disclosure may be a portable or mobile computing device, such as a terminal device, a mobile phone, a tablet computer, a notebook computer, a desktop computer, a game device, a vehicular electronic device or a wearable intelligent device, and other electronic devices such as an electronic database, an automobile and an automatic teller machine (ATM).

Further, the application layer is a display screen.

The components shown herein, and connections, relations and functions thereof are only illustrative, and are not intended to limit implementation of the present disclosure described and/or claimed herein.

What is claimed is:

1. An ultrasonic fingerprint identification apparatus, comprising: an integrated chip and a piezoelectric transducer, wherein a back surface of the integrated chip is connected to an application layer, and the piezoelectric transducer is located on a surface of the integrated chip; and through excitation of a driving pulse, the piezoelectric transducer transmits an ultrasonic signal to the application layer through the integrated chip, and a signal receiving circuit of the integrated chip receives an ultrasonic echo signal returned from a finger through the application layer;

wherein the piezoelectric transducer comprises a lower electrode and an upper electrode that are arranged on the surface of the integrated chip, and a piezoelectric layer located between the lower electrode and the upper electrode; and the lower electrode is electrically connected to the signal receiving circuit, the signal receiving circuit receives the ultrasonic echo signal by means of the lower electrode, and the lower electrode is an electrode array composed of a plurality of pixel electrodes.

2. The ultrasonic fingerprint identification apparatus according to claim 1, wherein the back surface of the integrated chip is connected to the application layer by means of a first bonding layer.

3. The ultrasonic fingerprint identification apparatus according to claim 1, wherein the signal receiving circuit comprises a plurality of receiving amplifiers and a plurality of receiving switches, and the receiving amplifiers, the receiving switches and the pixel electrodes are in one-to-one correspondence;

the receiving amplifiers are connected to the corresponding pixel electrodes; and one ends of the receiving switches are connected to the corresponding pixel electrodes, and the other ends of the receiving switches are grounded.

4. The ultrasonic fingerprint identification apparatus according to claim 1, wherein the signal receiving circuit comprises a plurality of switch groups and a plurality of receiving amplifiers, and one of the switch groups corresponds to one of the receiving amplifiers;

each of the switch groups comprises a plurality of first switches and a plurality of second switches, and the first switches and the second switches are in one-to-one correspondence to the pixel electrodes respectively;

one ends of the first switches are connected to the pixel electrodes, and the other ends of the first switches are grounded; and one ends of the second switches are connected to the pixel electrodes, and the other ends of the second switches are connected to the corresponding receiving amplifiers.

5. The ultrasonic fingerprint identification apparatus according to claim 1, wherein the electrode array is replaced by an electrode plate.

6. The ultrasonic fingerprint identification apparatus according to claim 1, wherein the surface of the integrated chip is further provided with a shielding electrode, and the shielding electrode is arranged around the lower electrode.

7. The ultrasonic fingerprint identification apparatus according to claim 1, wherein the surface of the integrated chip is provided with an upper electrode driving wire, and the upper electrode driving wire is electrically connected to the upper electrode.

8. The ultrasonic fingerprint identification apparatus according to claim 7, wherein a longitudinal section of the upper electrode is step-shaped, the upper electrode comprises a first electrode platform and a second electrode platform parallel to the surface of the integrated chip, and a longitudinal electrode connecting part that connects the first electrode platform and the second electrode platform and is perpendicular to the surface of the integrated chip, and the upper electrode driving wire is electrically connected to the second electrode platform.

9. The ultrasonic fingerprint identification apparatus according to claim 8, wherein a surface of the upper electrode driving wire is covered with a passivation layer, the passivation layer is provided with a window, and the upper electrode driving wire is electrically connected to the second electrode platform through the window.

10. The ultrasonic fingerprint identification apparatus according to claim 8, wherein the piezoelectric layer is embedded in an accommodating cavity defined by the first electrode platform and the longitudinal electrode connecting part.

11. The ultrasonic fingerprint identification apparatus according to claim 10, wherein the piezoelectric transducer further comprises a protective layer, and the protective layer covers a surface of the upper electrode away from the accommodating cavity.

12. The ultrasonic fingerprint identification apparatus according to claim 7, wherein the upper electrode is a silver paste coating.

13. The ultrasonic fingerprint identification apparatus according to claim 1, further comprising a driving circuit, wherein the driving circuit is electrically connected to the upper electrode of the piezoelectric transducer by means of an upper electrode driving wire arranged on the surface of the integrated chip, so as to transmit a driving pulse to the piezoelectric transducer; the driving circuit comprises a driver and a resonant circuit;

the driver comprises a driving switch, a grounding switch, and a driving resistor, one end of the driving switch is connected to a driving power supply, and the other end of the driving switch is connected to the driving resistor; one end of the grounding switch is grounded, and the other end of the grounding switch is connected to one side, connected to the driving switch, of the driving resistor;

the resonant circuit comprises an inductor, an equivalent resistor, and a capacitor, one end of the inductor is connected to one side of the driving resistor away from the driving switch, and the other end of the inductor is connected to the equivalent resistor; one side of the equivalent resistor away from the inductor is connected to the capacitor; and one end of the capacitor away from the equivalent resistor is grounded.

14. The ultrasonic fingerprint identification apparatus according to claim 13, wherein the driving circuit further comprises a braking circuit, the braking circuit comprises a damping resistor, one end of the damping resistor is connected between the driving resistor and the inductor, and the other end of the damping resistor is grounded.

15. The ultrasonic fingerprint identification apparatus according to claim 13, wherein the driver further comprises a control circuit arranged on the integrated chip, and the control circuit controls the driving switch and the grounding switch to be turned on and off, such that a driving pulse generated by the driving circuit is a sinusoidal pulse.

16. The ultrasonic fingerprint identification apparatus according to claim 1, wherein a supporting layer is further arranged between the back surface of the integrated chip and the application layer, the supporting layer is bonded to the back surface of the integrated chip by means of a first bonding layer and bonded to the application layer by means of a second bonding layer, and the supporting layer is a wave guiding layer configured to enhance conduction of the ultrasonic signal and the ultrasonic echo signal.

17. An electronic device, comprising:

an application layer; and the ultrasonic fingerprint identification apparatus according to claim 1, which is configured to identify a fingerprint of the application layer.

18. The electronic device according to claim 17, wherein the application layer is a display screen.

19. A lamination thickness adjustment method for the ultrasonic fingerprint identification apparatus according to claim 1, wherein a piezoelectric transducer comprises a lower electrode, an upper electrode, a piezoelectric layer and a protective layer arranged on a surface of an integrated chip, and the method comprises:

obtaining a target working frequency of a driving pulse;

computing, according to longitudinal wave velocities of an ultrasonic echo signal in the protective layer, the upper electrode, the piezoelectric layer and the integrated chip, a reflecting frequency of the ultrasonic echo signal with a thickness of the protective layer, a thickness of an upper electrode layer, a thickness of the piezoelectric layer, and a thickness of the integrated chip; and gradually adjusting, according to a difference between the reflecting frequency and the target working frequency, the thickness of the protective layer, the thickness of the upper electrode layer, the thickness of the piezoelectric layer and/or the thickness of the integrated chip according to a preset adjustment step size, and determining a target protective layer thickness, a target upper electrode layer thickness, a target piezoelectric layer thickness and/or a target integrated chip thickness with the reflecting frequency equal to the target working frequency.

* * * * *